(12) United States Patent
Lu

(10) Patent No.: US 7,022,452 B2
(45) Date of Patent: Apr. 4, 2006

(54) CONTRAST ENHANCED PHOTOLITHOGRAPHY

(75) Inventor: Jennifer Lu, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 240 days.

(21) Appl. No.: 10/234,931

(22) Filed: Sep. 4, 2002

(65) Prior Publication Data

US 2004/0043328 A1 Mar. 4, 2004

(51) Int. Cl.
- G03F 7/004 (2006.01)
- G03F 7/012 (2006.01)
- G03F 7/30 (2006.01)

(52) U.S. Cl. ............ 430/156; 430/157; 430/162; 430/273.1; 430/326; 430/512

(58) Field of Classification Search ........ 430/156, 430/157, 162, 512, 326, 273.1
See application file for complete search history.

(56) References Cited

U.S. PATENT DOCUMENTS

| | | | | |
|---|---|---|---|---|
| 4,622,283 A | * | 11/1986 | Gray | 430/191 |
| 4,624,908 A | * | 11/1986 | Schwartzkopf | 430/192 |
| 4,672,021 A | | 6/1987 | Blumel et al. | |
| 4,677,049 A | | 6/1987 | Griffing et al. | |
| 4,804,614 A | | 2/1989 | Halle | |
| 4,889,795 A | | 12/1989 | Kaifu et al. | |
| 4,925,770 A | * | 5/1990 | Ichimura et al. | 430/273.1 |
| 4,942,113 A | | 7/1990 | Trundle | |
| 4,996,301 A | * | 2/1991 | Wilharm et al. | 534/556 |
| 5,039,596 A | * | 8/1991 | Wu et al. | 430/326 |
| 5,106,723 A | | 4/1992 | West et al. | |
| 5,196,295 A | * | 3/1993 | Davis | 430/273.1 |
| 5,198,322 A | * | 3/1993 | Wilharm et al. | 430/189 |
| 5,264,511 A | | 11/1993 | Walton | |
| 5,272,036 A | * | 12/1993 | Tani et al. | 430/191 |
| 5,290,666 A | * | 3/1994 | Hashimoto et al. | 430/326 |
| 5,342,727 A | | 8/1994 | Vicari et al. | |
| 5,707,776 A | | 1/1998 | Kawabe et al. | |
| 2002/0012867 A1 | | 1/2002 | Yasuda | |

OTHER PUBLICATIONS

Griffing B. F.; West P. R.; "Contrast Enhanced Photolithography," IEEE Trans. Device Letters, vol. EDL-4, No. 1, Jan. 1983, p. 14.

Griffing B. F.; West P. R.; "Contrast Enhanced Lithography," Solid State Technol., 1985, 28(5), p. 152.

West P. R.; Davis P. W.; "Contrast Enhancement Materials for Mid-UV Applications," Regh K. A.; SPIE, Adv. Resist Technol. vol. 920, 1988, p. 75.

West P. R.; Griffing, B. F.; "Contrast Enhanced Photolithography: Application of Photobleaching Processes in Microlithography," Journal of Imaging Science, vol. 30, No. 2, Mar.-Apr. 1986, p. 65.

Thompson L. F.; Willson G. C.; Bowden M. J.; Introduction to Microlithography, p. 252.

Rathsack B. M. ; Tattersall P. I.; Tabery C. E.; et al; "The Rational Design of Bleachable Non-Chemically Amplified DUV Photactive Compounds," SPIE, Adv. Resist Technol. vol. 4345, 2001, p. 543.

Willson, C. G.; Miller, R. D.; McKean, D. R.; Pederson, L. A; "New Diazoketone Dissolution Inhibitors for Deep UV Photolithography," SPIE vol. 771, Adv. Resist Technol., 1987, p. 2.

Grant, B. D.; Clecak, N.J.; Twieg, R. J.; Willson, C. G.; "Deep UV Photoresists I. Meldrum's Diazo Sensitizer," IEEE Trans. Device Letters, vol. ED-28 No. 11, Nov. 1981, p. 1300.

Reiser, A and Wagner, H. M. in "The Chemistry of the Azido Group" (Patai, S., Ed.), John Wiley, 1971. p. 446.

Regitz, M. "Diazoalkane, Eigenschafter und Synthesen" Verlag. Stuttgart, 1977, p. 12.

Smolinsky, G. J. "Thermal Reactions of Substituted Aryl Azides: The Nature of the Azene Intermediate," Am. Chem. Soc., vol. 83, 1961, p. 2489.

Masamune, T. "The Ultraviolet Absorption Spectra of Stereoisomeric 1,2,3,4,9,10,4a,9a-Octahydroacridines and Related Compounds," J. Am. Chem. Soc. vol. 79, 1957, p. 4418.

Fuchigami H. et al; "Organic Molecular Beam Deposition Combined With A Laser-Induced Chemical Reaction," Appl. Phys. A vol. 67, 1998, p. 277.

Meier, H.; Zeller, K.-P.; "The Wolff Rearrangement of alpha-Diazo Carbonyl Compounds," Chem. Intern. Ed. Eng. 14, 1975, p. 38.

Turro, N. J., "Modern Molecular Photochemistry" Benjamin/Cummings: Menlo Park, CA; 1978, p. 551.

* cited by examiner

Primary Examiner—John S. Chu

(57) ABSTRACT

Contrast enhanced photolithography methods and devices formed by the same are described. In accordance with these methods, a photoresist layer is formed on a substrate. A contrast enhancing system including a solution or dispersion of a photobleachable dye is formed on the photoresist layer. The photoresist layer is exposed through an imaging pattern and through the contrast enhancing system to radiation having a wavelength between about 230 nm and about 300 nm. The contrast enhancing layer is removed, and the photoresist layer is developed to form a photoresist pattern on the substrate. The contrast enhancing system may be removed and the photoresist layer may be developed in a single process step or in different process steps.

40 Claims, 5 Drawing Sheets

CONTRAST ENHANCED PHOTOLITHOGRAPHY

BACKGROUND

Over recent years, dramatic reduction of circuit dimensions to improve device performance and increase packing density in the integrated circuit (IC) industry has been achieved by the continuous innovation of optical imaging systems. Exposure tools with shorter exposure wavelengths and higher numeric apertures coupled with higher contrast resists have emerged successively to enable the replication of ever-shrinking features from reticles to resist coated wafers. For technologies with 150 nm features and smaller, it is rather difficult to provide manufacturable photolithography processes for 248 nm wavelength exposure tools without any optical enhancement techniques. Reduction of the exposure wavelength from 248 nm to 193 nm and to 157 nm demands enormous research and development efforts due to the limited material availability for projection lenses, reticles, and photoresists at these short wavelengths. Although significant progress has been made in 193 nm lithographic systems, some problems remain unsolved and currently prohibit these systems from becoming the technology of choice. These problems include the low etch resistance of 193 nm resists and pattern orientation dependent imaging caused by the presence of birefringence in the lens material used in 193 nm exposure tools.

As an alternative to developing shorter wavelength exposure systems, various complicated and costly optical enhancement techniques, such as phase shift mask and off-axis illumination, have been proposed to extend the lifetime of 248 nm lithography tools. The improvement in the resolution of 248 nm lithographic tools also may be obtained by using an inexpensive contrast enhancing layer (CEL) over the resist. This approach has been used in g-line, h-line and i-line photolithography to improve imaging resolution. Meldrum's diazo compound has been proposed as a photobleachable dye for deep ultraviolet (DUV) contrast enhancement materials (see Thompson L. F.; Willson G. C.; Bowden M. J.; Introduction to Microlithography, P. 252). However, it is known that Meldrum's diazo compound and its derivatives suffer from the problem of excessive loss during soft bake and, therefore, are not good candidates for use as DUV contrast enhancement materials (see Grant, B. D.; Clecak, N. J.; Twieg, R. J.; Willson, C. G.; IEEE Trans. Device Letters, Vol. ED-28 No. 11, 11/1981, P. 1300).

SUMMARY

The invention features contrast enhanced photolithography methods in accordance with which contrast enhancing layers are used to improve the imaging capability of DUV radiation (e.g., with wavelengths between about 230 nm and about 300 nm) exposure tools and potentially extend their use to fabricate 150 nm, 130 nm and smaller features.

In accordance with these methods, a photoresist layer is formed on a substrate. A contrast enhancing system comprising a solution or dispersion of a photobleachable dye is formed on the photoresist layer. In some embodiments, the photobleachable dye solution or dispersion is formed directly on the photoresist layer. In other embodiments, the contrast enhancing system includes a barrier layer that is disposed between the photoresist layer and the photobleachable dye solution or dispersion. The photoresist layer is exposed through an imaging pattern and through the contrast enhancing system to radiation having a wavelength between about 230 nm and about 300 nm. The contrast enhancing system is removed, and the photoresist layer is developed to form a photoresist pattern on the substrate. The contrast enhancing system may be removed and the photoresist layer may be developed in a single process step or in different process steps.

In one aspect of the invention, the photobleachable dye has a formula

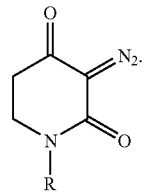

In another aspect of the invention, the photobleachable dye has a formula

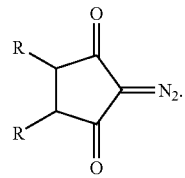

In another aspect of the invention, the photobleachable dye has a formula

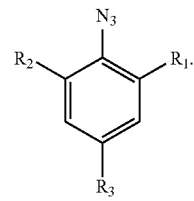

In another aspect of the invention, the contrast enhancing layer comprises a solution or dispersion of a photobleachable dye that is isomerizable upon exposure to radiation having a wavelength between about 230 nm and about 300 nm from a cis-isomer that is substantially absorptive of radiation having a wavelength between about 230 nm and about 300 nm to a trans-isomer that is substantially transmissive to radiation having a wavelength between about 230 nm and about 300 nm.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
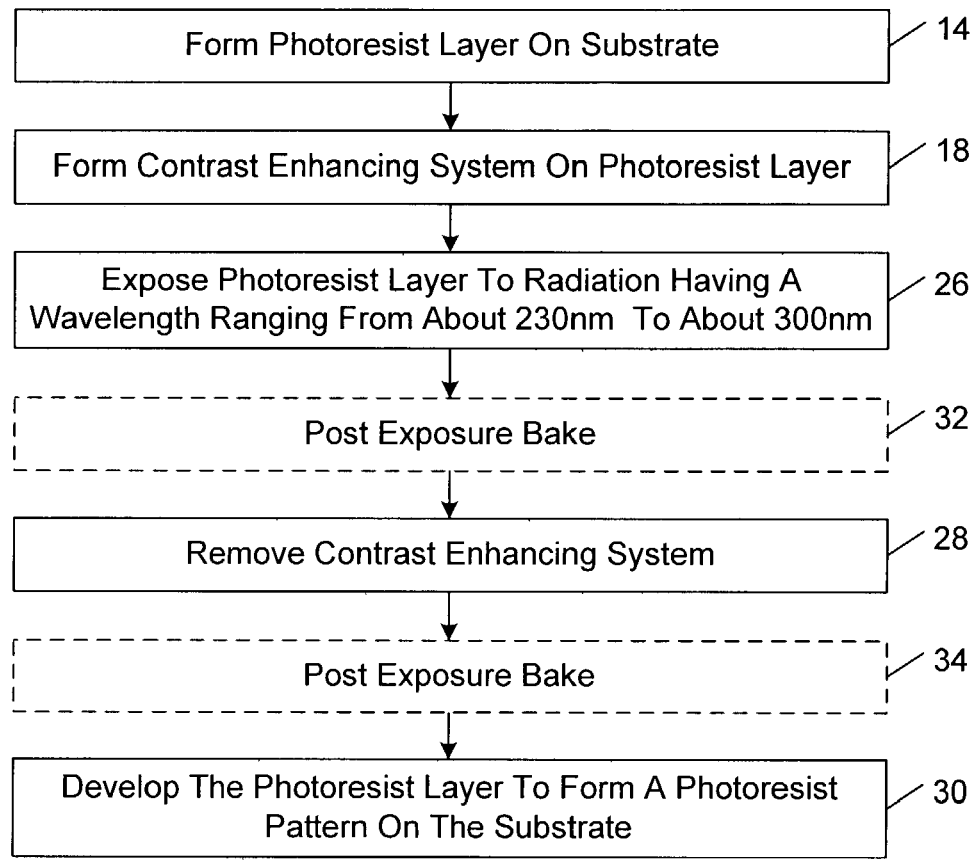
FIG. 1 is a flow diagram of a contrast enhanced photolithographic method.
Figure 2:
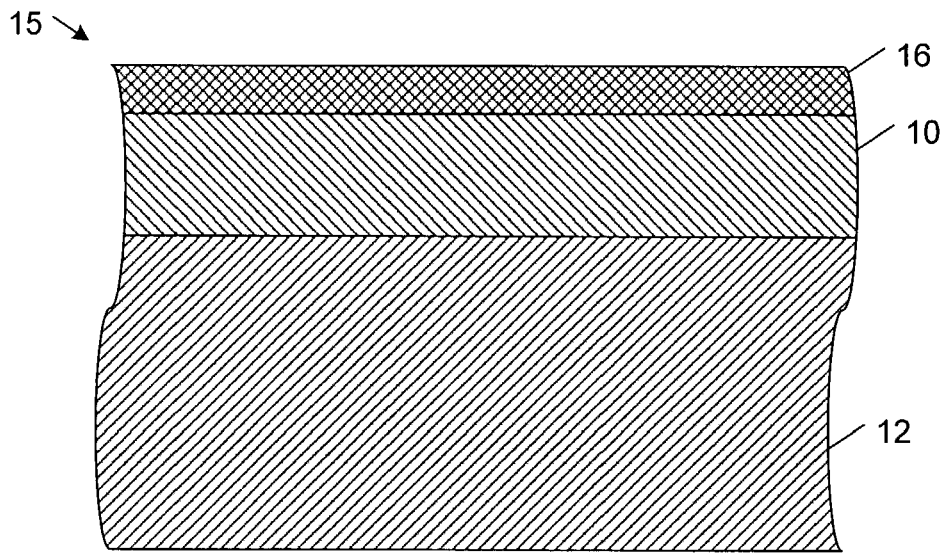
FIG. 2 is a diagrammatic cross-sectional side view of a substrate coated with a photoresist layer and an overlying contrast enhancing system that includes a photobleachable dye solution or dispersion that is formed directly on the photoresist layer.
Figure 3:
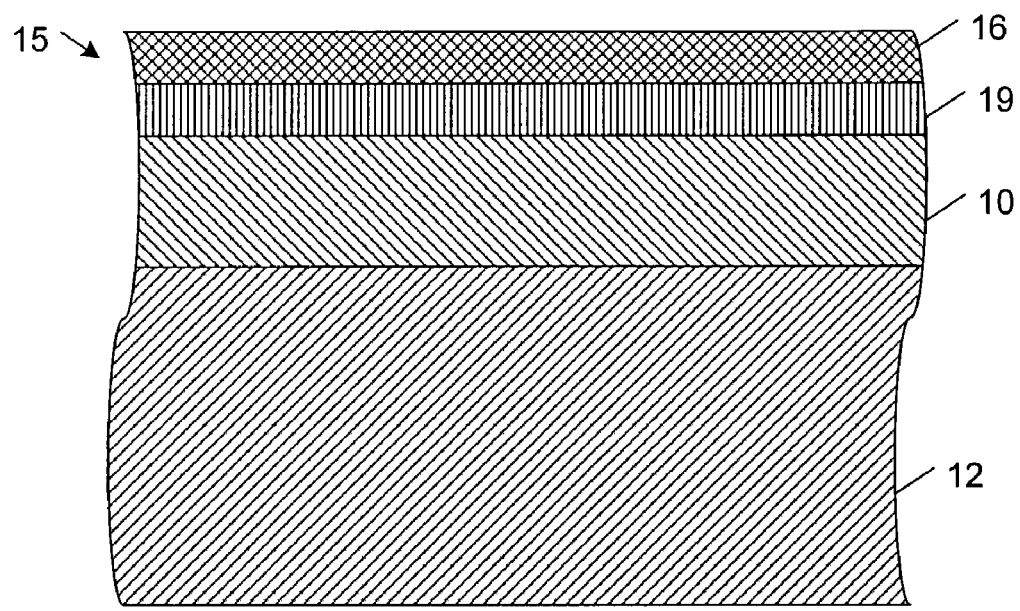
FIG. 3 is a diagrammatic cross-sectional side view of a substrate coated with a photoresist layer and an overlying contrast enhancing system that includes a barrier layer that is formed directly on the photoresist layer and a photobleachable dye solution or dispersion that is formed on the barrier layer.

Referring to FIGS. 1, 2, 3, 4, 5, 6 and 7, and initially to FIGS. 1–3, in one contrast enhanced photolithographic method, a photoresist layer 10 may be patterned as follows.

Initially a photoresist layer 10 is formed on a substrate 12 (step 14; FIG. 1).

In general, substrate 12 may be in the form of any material or structure on which a patterned photoresist layer may serve a useful purpose. Photoresist layer 10 may be formed from any one of a wide variety of known photoresists compositions that are photoresponsive to DUV radiation having a wavelength preferably in a range from about 230 nm to about 300 nm and, more preferably in a range from about 245 nm to about 260 nm.

Next, a contrast enhancing system 15 is formed on the photoresist layer 10 (step 18; FIG. 1). As shown in FIG. 2, in some embodiments, the contrast enhancing system may include a contrast enhancing layer 16 that is formed directly on photoresist layer 10. Alternatively, as shown in FIG. 3, in other embodiments, the contrast enhancing system may include a barrier layer 19 that is disposed between contrast enhancing layer 16 and photoresist layer 10. Barrier layer 19 preferably is configured to prevent interfacial mixing of the photoresist layer 10 and the contrast enhancing layer 16.

Contrast enhancing layer 16 preferably includes a photobleachable material (or dye) that is dispersed in a polymer resin. In general, contrast enhancing layer 16 should have the following properties. The absorption or the extinction coefficient for the photobleachable material should be reasonably high, and the absorption or extinction coefficients of the photoproducts should be relatively small at the exposure wavelength. The quantum yield of the bleaching reaction also should be relatively high. Because of the change to non-polar constituents, the contrast enhancing layer becomes insoluble in water. However its removal in water or developer is facilitated by the presence of the water soluble barrier layer beneath it that serves as a lift-off layer. The polymer resin should have high transmission at the exposure wavelength. Good polymer binder candidates for contrast enhancing layer 16 are acrylic acid polymer, an acrylic acid copolymer, cellulose derivatives, poly(acrylamide), a copolymer of methacrylic acid, polyvinyl alcohol, or a copolymer of polyvinyl alcohol, and polystyrene and copolymer of polystyrene. Materials that may be used as photobleachable dyes in contrast enhancing layer 16 for DUV exposure wavelengths are identified in the Examples presented below.

In general, barrier layer 19 preferably is substantially transparent to radiation wavelengths in the range of about 230–300 nm. Barrier layer 19 is composed of a water soluble material, such as acrylic acid polymer, an acrylic acid copolymer, cellulose derivatives, poly(acrylamide), a copolymer of methacrylic acid, polyvinyl alcohol, or a copolymer of polyvinyl alcohol. In the embodiment illustrated in FIG. 3, barrier layer 19 is coated on top of photoresist layer 10, and, subsequently, contrast enhancing layer 16 is deposited on top of barrier layer 19. In this embodiment, the preferred constituents of contrast enhancing layer 16 have less-polar substituent groups, a less-polar solvent, and a less-polar polymer binder to avoid intermixing with barrier layer 19.

Figure 4:
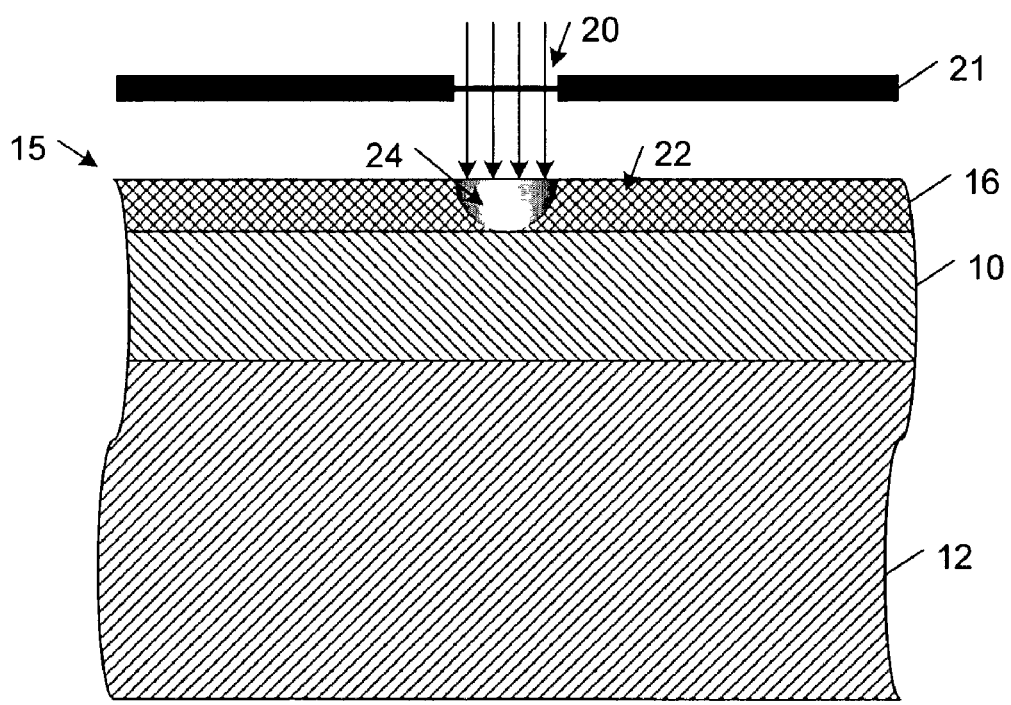
FIG. 4 is a diagrammatic cross-sectional side view of the coated substrate of FIG. 2 as the contrast enhancing layer is being bleached by DUV radiation delivered through an imaging pattern.
Figure 5:
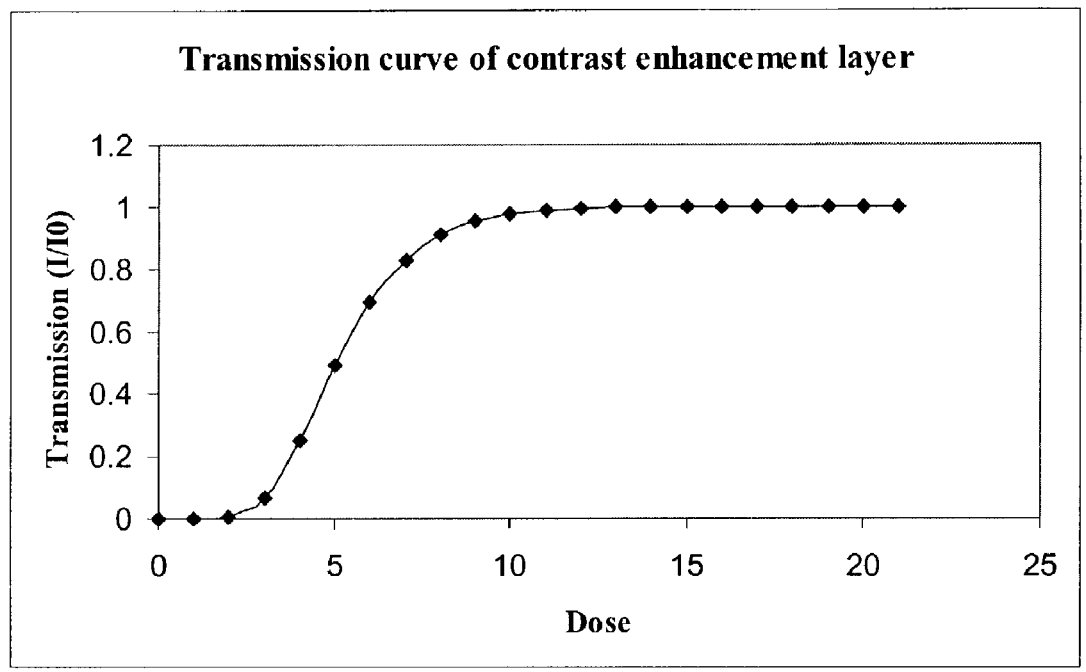
FIG. 5 is a diagrammatic graph of transmission through the contrast enhancing layer of FIG. 4 plotted as a function of radiation dose.
Figure 6:
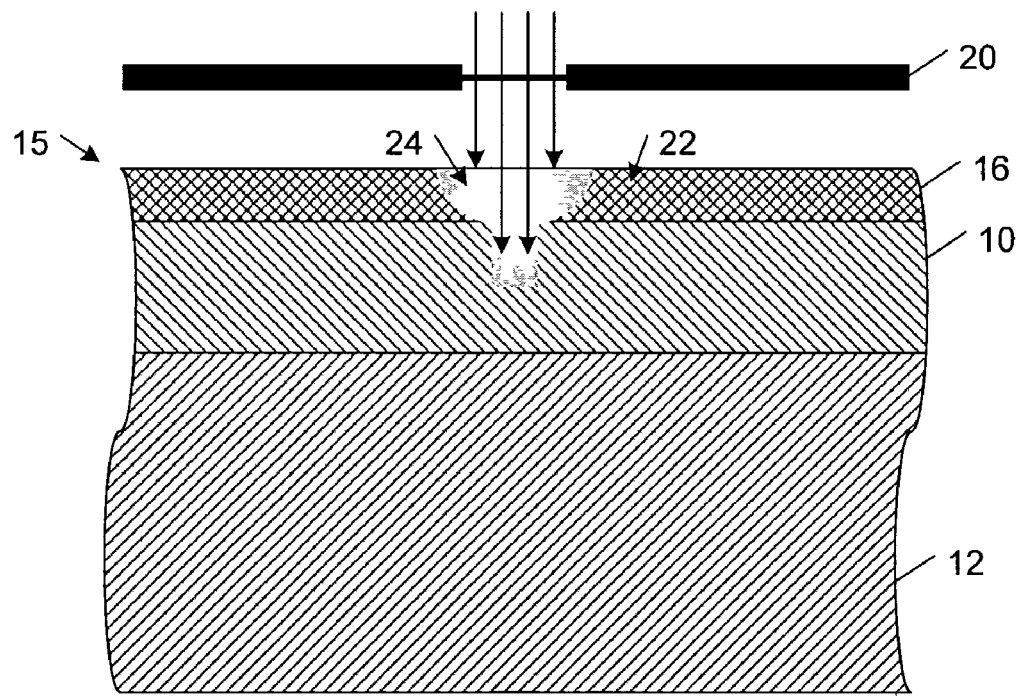
FIG. 6 is a diagrammatic cross-sectional side view of the coated substrate of FIG. 4 as the photoresist layer is being exposed to DUV radiation through the to imaging pattern and through the bleached region of the contrast enhancing layer.
Figure 7:
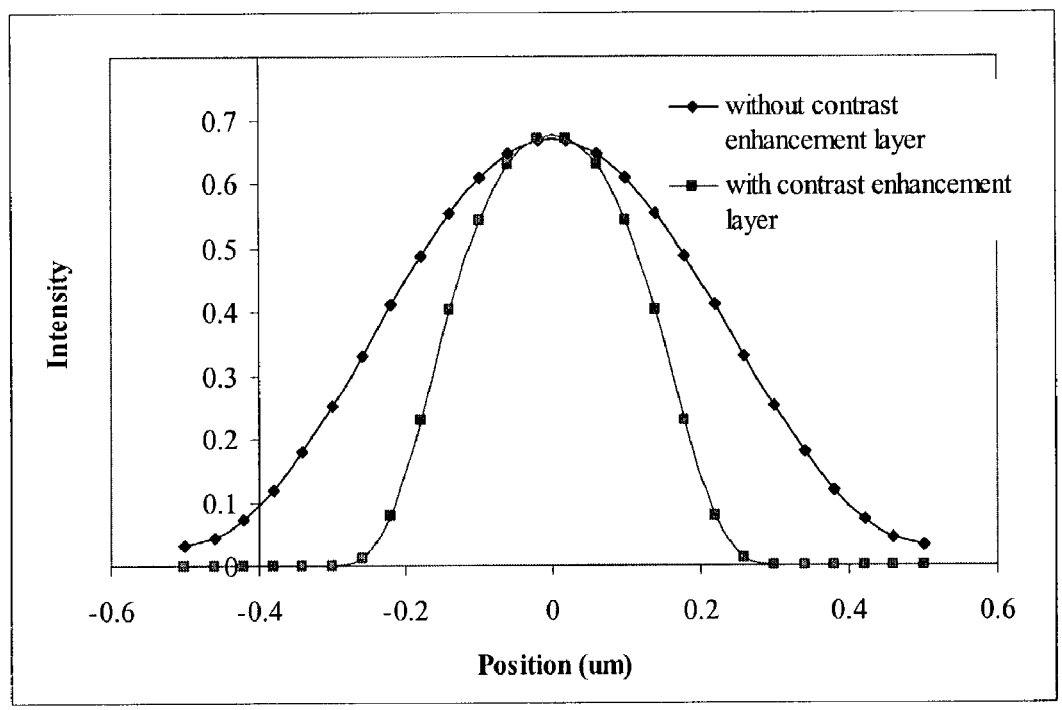
FIG. 7 is a diagrammatic graph of radiation intensity delivered to a photoresist layer plotted as a function of lateral position across the photoresist layer for cases with and without an overlying contrast enhancing layer.

Referring to FIGS. 1 and 4–7, and initially to FIG. 4, contrast enhancing layer 16 is exposed to DUV radiation in the wavelength range of about 230–300 nm through an imaging pattern 20 in a photomask 21. In response, contrast enhancing layer 16 undergoes a nonlinear optical absorption change from a form 22 that is highly absorptive of DUV radiation into a form 24 that is relatively transparent to DUV radiation, as illustrated in the plot of FIG. 5 in which I is the intensity of radiation transmitted through contrast enhancing layer 16 and $I_0$ is the intensity of radiation incident upon contrast enhancing layer 16 (step 26; FIG. 1). Because the contrast enhancing layer 16 is bleached most rapidly in areas of highest radiation intensity, it bleaches more in the center of the opening than the edges as shown diagrammatically in FIG. 4. Therefore, contrast enhancing layer 16 allows the high intensity portions of the aerial image (i.e., the map of light intensity at the image plane after exposure through photomask 21) to be preferentially transmitted to photoresist layer 10 (see FIG. 6). Accordingly, the resolution of the image that is incident upon the underlying photoresist layer 10 is improved significantly. The improvement of image resolution in the resist for DUV radiation exposure has been simulated and the results are shown in FIG. 7. The contrast enhancing layer 16 may be viewed as a conforming contact mask that is formed dynamically over the underlying resist layer 10 during exposure.

After the photoresist layer 10 has been exposed to the DUV radiation through the imaging pattern 20 and through the contrast enhancing system 15 (step 26; FIG. 1), the contrast enhancing layer 16 is removed (step 28; FIG. 1) and the photoresist layer 10 is developed to form a photoresist pattern on substrate 12 (step 30; FIG. 1). The contrast enhancing system may be removed and photoresist layer 10 may be developed in the same processing step or in different processing steps, depending upon the compositional nature of contrast enhancing system. For example, in embodiments in which the contrast enhancing system is soluble in the same developer used to develop photoresist layer 10, the contrast enhancing system may be removed and photoresist layer 10 may be developed in the same processing step. In other embodiments, the contrast enhancing system may be removed by rinsing with or immersing in a solvent (e.g., water or an organic solvent) and, subsequently, photoresist layer 10 may be developed using a different developing solution (e.g., an aqueous alkaline solution).

The above-described contrast enhanced photolithographic embodiments may include one or more steps in addition to the process steps listed in FIG. 1. For example, various soft and hard baking steps, various cleaning steps, and other photolithographic processing steps that are readily apparent to one having ordinary skill in the art may be incorporated into these embodiments. In some embodiments, for example, photoresist layer 10 may be heated to a temperature between about 40° C. and 140° C. before (step 32; FIG. 1) or after (step 34; FIG. 1) the contrast enhancing system has been removed (step 28; FIG. 1). In some embodiments, the above-described contrast enhanced photolithographic embodiments may be used in combination with other resolution enhancing techniques (e.g., off-axis illumination or phase-shifted reticle) to improve the patterning capability of DUV (e.g., 248 nm) lithographic systems for fabrication of next generation, state of the art integrated circuit devices.

The above-described contrast enhanced photolithographic embodiments may be incorporated readily into known processes for making devices, including electronic devices, optical devices, and opto-electronic devices.

Exemplary photobleachable dyes that may be incorporated alone or in combination into contrast enhancing layer 16 are the following.

EXAMPLE 1

In some implementations, the photobleachable compound may have the following general formula:

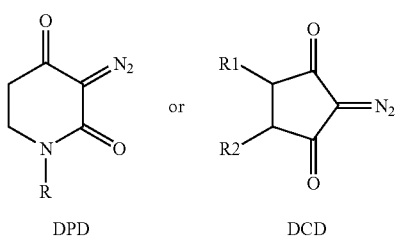

DPD                DCD

Exemplary compounds of this type include diazopiperidinedione compounds (DPD's) and 2-diazocyclopentane-1,3 dione compounds (DCD's). These materials have strong absorbance with extinction coefficients around 14,000 at 248 nm and bleach at 248 nm on photolysis in accordance with Equations (1) and (2).

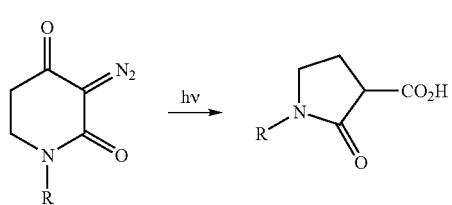

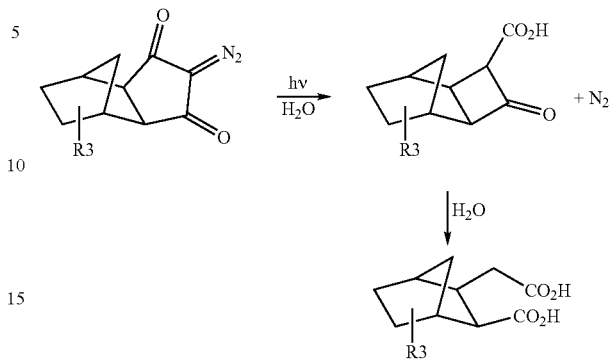

Figure 8:
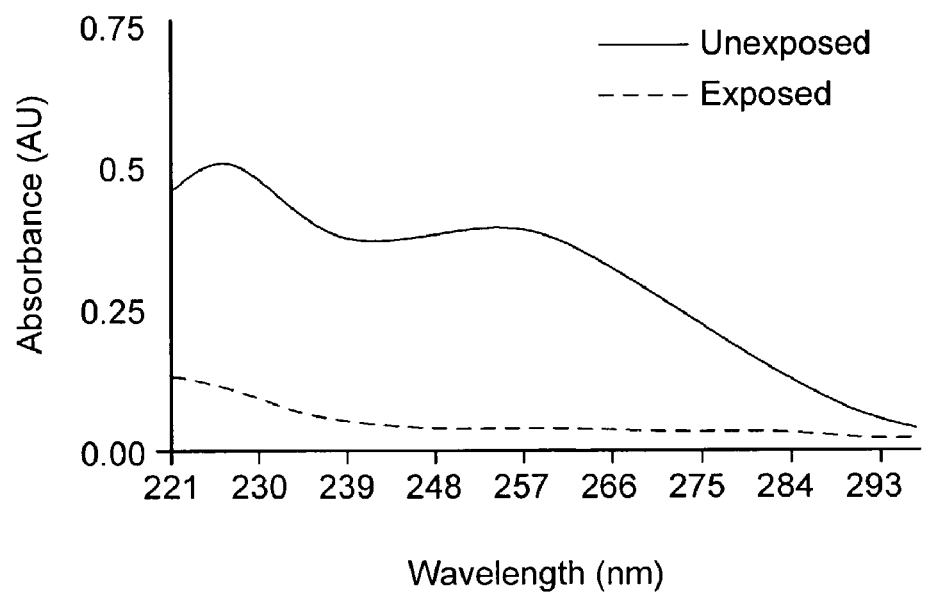
FIG. 8 is a graph of absorbance plotted as a function of wavelength for is exposed and unexposed diazopiperidinedione compounds (DPD's).

As shown in FIG. 8 (source: Rathsack B. M., et al., SPIE, Adv. Resist Technol., Vol. 4345, p. 543, 2001), the ratios of absorbance before and after bleach are very high with the absence of aromatic rings. These compounds are not volatile and remain in the polymeric binder during soft bake. The quantum yield of these compounds around 248 nm typically is high. For example, diazopiperidinedione (DPD's) compounds (e.g., 3-diazopiperidine-2,4-dione) and 2-diazocyclopentane-1,3 dione (DCD's) compounds photodecompose with quantum yields reported as high as 0.6. Therefore, a rapid bleaching reaction upon exposure is expected. These compounds may be rendered soluble in polar casting solvents (e.g., water) by incorporation of polar substituent groups (R, R1, and R2) selected from carboxylic acid, substituted carboxylic acid, alcohol, hydroxyalkyl, and substituted hydroxyalkyl groups or similar groups that increase water solubility. These compounds may be formulated with water soluble is polymer binders, such as acrylic acid polymer, an acrylic acid copolymer, cellulose derivatives, poly(acrylamide), a copolymer of methacrylic acid, polyvinyl alcohol, or a copolymer of polyvinyl alcohol, that are weakly absorbing or nonabsorbing of 248 nm radiation. The photobleachable dye solution or dispersion may be composed of between about 20 and 50% by weight photobleachable dye.

In embodiments of this exemplary type that include a barrier layer, the barrier layer preferably is composed of a water soluble polymer, such as an acrylic acid polymer, an acrylic acid copolymer, cellulose derivatives, poly(acrylamide), a copolymer of methacrylic acid, polyvinyl alcohol, or a copolymer of polyvinyl alcohol. In these embodiments, the materials in the contrast enhancing layer may be selected to facilitate dissolution in a less-polar solvent (e.g., propylene glycol methyl ether acetate). For example, the polymer binder may be poly(methyl methacrylate), a copolymer of poly(methyl methacrylate), and the R groups that are attached to 3-diazo-piperidine-2,4-dione or 2-diazo-cyclopentane-1,3-dione compounds may be less polar (e.g., alkyl or aryl groups) than embodiments in which the contrast enhancing layer is formulated for direct deposit on photoresist layer 10.

EXAMPLE 2

In some implementations, the photobleachable compound may be an aromatic azide compound having the following general formula:

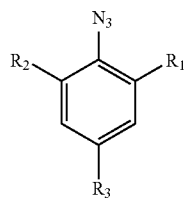

Aromatic azide compounds absorb strongly at 248 nm with extinction coefficients ($\epsilon$) approaching 10,000 liter/(cm*mole). Aromatic azide compounds also are highly photoreactive and decompose to give nitrene intermediates which react further to give the final products. The photolytic decomposition of aromatic azides is very efficient with quantum yields ranging from 0.4–1.0 at 248 nm. The nitrene decomposition pathway is dependent on the nature of the substituents $R_1$, $R_2$, and $R_3$. One or more substituents $R_1$, $R_2$, and $R_3$ may be polar substituents. For example, in some embodiments, one or both of substituents $R_1$ and $R_2$ may be cyclohexyl, and the remaining R groups may be alkyl, arylalkyl, alkoxycarbonyl, carboxylic acids, hydroxyalkyl, alkoxy, sulfonyl and nitro groups. Preferably, one or more of the substituents $R_1$, $R_2$, and $R_3$ represent carboxylic acid or substituted carboxylic acid groups or hydroxyalkyl or substituted hydroxyalkyl groups or similar polar functional groups that increase water solubility. In embodiments in which $R_1$ or $R_2$ is cyclohexyl, the nitrene cyclizes to give hexahydrocarbazole in high yield (e.g., up and about 86%) from the nitrene in accordance with Equation (3).

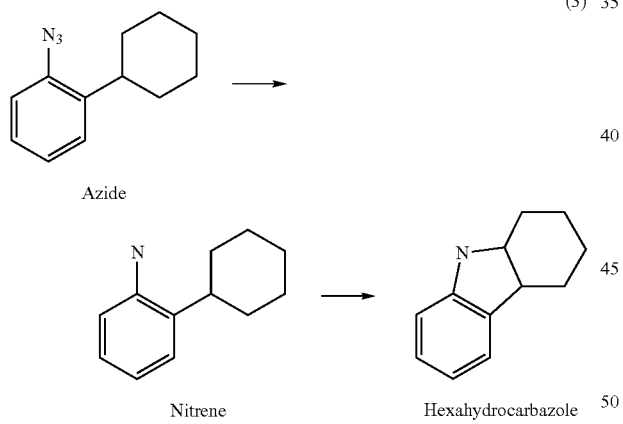

(3)

Hexahydrocarbazole is fairly transparent at 248 nm, particularly in acidic media with extinction coefficients in the 300–400 range. This provides a bleaching ratio ($\epsilon_{dye}/\epsilon_{product}$, where $\epsilon_{dye}$ is the extinction coefficient of the photobleachable dye and $\epsilon_{product}$ is the extinction coefficient of the photoproduct) as high as 30. 2-cyclohexyl-1-azidobenzene derivatives containing carboxylic acid or hydroxyalkyl or substituted hydroxyalkyl groups or similar polar functional groups in substituents $R_{1-3}$ may be soluble in water. The preferred polymer binders are acidic resins such as a homopolymer of polyacrylic acid, polymethacrylic acid, acrylic copolymers of polyacrylic and polymethacrylic acid and ethylene copolymers of polyacrylic and polymethacrylic acid. The acidic polymeric binders also have the advantage of being efficient scavengers of basic contaminants (amines) that can poison chemically amplified DUV photoresists. The photobleachable dye solution or dispersion preferably includes a polar solvent (e.g., water). The photobleachable dye solution or dispersion may be composed of between about 20 and 50% by weight photobleachable dye.

In embodiments of this exemplary type that include a barrier layer, the barrier layer preferably is composed of a water soluble polymer, such as acrylic acid polymer, an acrylic acid copolymer, cellulose derivatives, poly(acrylamide), a copolymer of methacrylic acid, polyvinyl alcohol, or a copolymer of polyvinyl alcohol. In these embodiments, the materials in the contrast enhancing layer may be selected to facilitate dissolution in a less-polar solvent (e.g., propylene glycol methyl ether acetate). The polymer binder preferably is not water soluble but contains some acidic groups (e.g., a copolymer of poly(acrylic acid) or poly(methacrylic acid)). The $R_{1-3}$ groups of the aromatic azide may contain cyclohexyl as well as other nonpolar alkyl groups.

EXAMPLE 3

Figure 9:
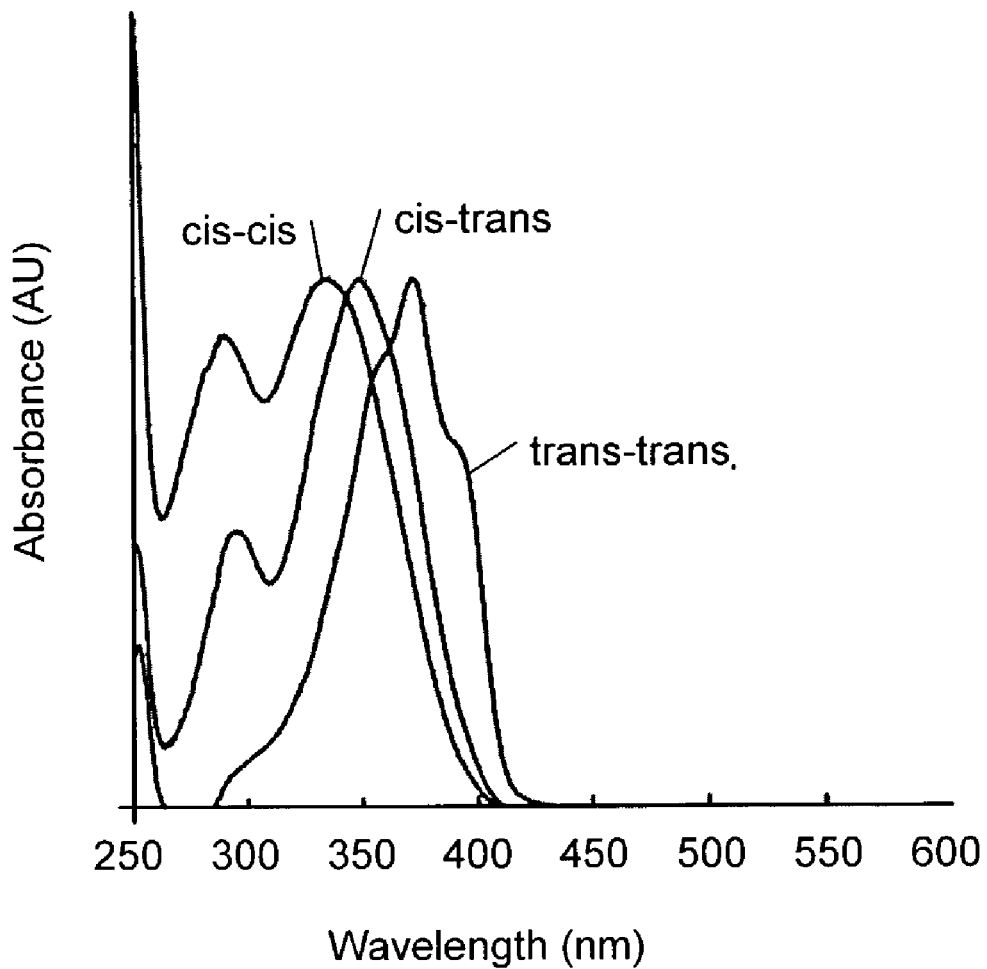
FIG. 9 is a graph of absorbance plotted as a function of wavelength for the cis-cis, cis-trans, and trans-trans isomers of 1,4-bis(4-ethynylstyryl) benzene.

In some implementations, the photobleachable compound may undergo cis-to-trans isomerization upon 248 nm irradiation. For example, 1,4-bis(4-ethynylstyryl) benzene has three isomers: cis-cis; cis-trans; and trans-trans. As show in FIG. 9 (source: Fuchigami H. et al, Appl. Phys. A, Vol. 67, p. 277, 1998), the cis-cis isomer has very strong absorption at 248 nm and is transformed to the highly transparent trans-trans isomer upon 248 nm illumination in accordance with Equation (4).

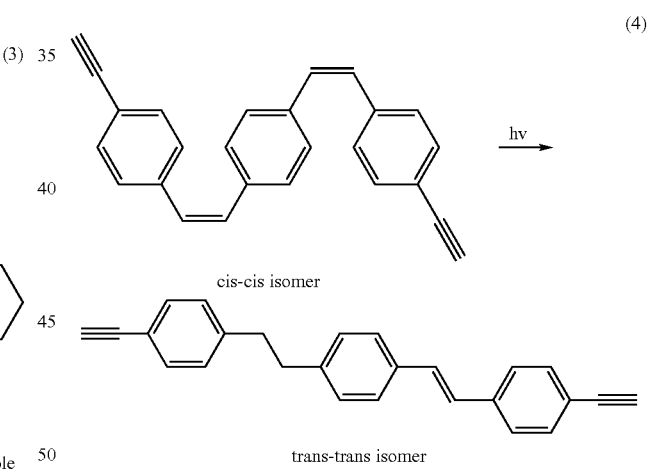

(4)

Nonpolar polymer binders such as polystyrene and nonpolar acrylics may be used as a polymer matrix for 1,4-bis (4-ethynylstyryl) benzene. The photobleachable dye solution or dispersion preferably includes a non-polar solvent and is composed of between about 20 and 50% by weight photobleachable dye. In the embodiments of Example 3, where no barrier layer is used, the CEL layer must be removed with a nonpolar solvent prior to development.

In embodiments of this exemplary type that include a barrier layer, the barrier layer is preferably composed of a water soluble polymer such as acrylic acid polymer, an acrylic acid copolymer, cellulose derivatives, poly(acrylamide), a copolymer of methacrylic acid, polyvinyl alcohol, or a copolymer of polyvinyl alcohol. In these embodiments, the contrast enhancing layer may be composed of a 1,4-bis (4-ethynylstyryl)benzene compound dispersed in a polystyrene or nonpolar acrylic polymers.

Other embodiments are within the scope of the claims.

What is claimed is:

1. A contrast enhanced photolithographic method, comprising:

forming a photoresist layer on a substrate;

forming on the photoresist layer a contrast enhancing system comprising a solution or dispersion comprising a photobleachable dye having a formula selected from the group consisting of

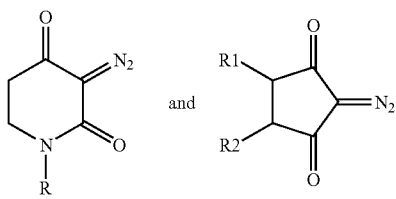

wherein one or more of R, R1, and R2 represents a polar substituent group selected from a carboxylic acid, a substituted carboxylic acid, a hydroxyalkyl, and a substituted hydroxyalkyl;

through an imaging pattern and through the contrast enhancing system exposing the photoresist layer to radiation having a wavelength between about 230 nm and about 300 nm;

removing the contrast enhancing system; and developing the photoresist layer to form a photoresist pattern on the substrate.

2. The method of claim 1, further comprising heating the photoresist layer to a temperature between about 40° C. and about 140° C. before or after the contrast enhancing system has been removed.

3. The method of claim 1, wherein the photobleachable dye solution or dispersion is formed directly on the photoresist layer.

4. The method of claim 3, wherein the photobleachable dye solution or dispersion further comprises a water soluble polymer binder selected from an acrylic acid polymer, an acrylic acid copolymer, a cellulose derivative, a poly(acrylamide), a copolymer of methacrylic acid, polyvinyl alcohol, and a copolymer of polyvinyl alcohol.

5. The method of claim 3, wherein the contrast enhancing system is removed and the photoresist layer is developed during the same processing step.

6. The method of claim 3, wherein the photobleachable dye solution or dispersion further comprises a polar solvent.

7. The method of claim 6, wherein the polar solvent comprises water or solutions of water and water-miscible solvents.

8. The method of claim 1, wherein the contrast enhancing system further comprises a barrier layer disposed between the photoresist layer and the photobleachable dye solution or dispersion.

9. The method of claim 8, wherein the barrier layer comprises a water soluble polymer selected from an acrylic acid polymer, an acrylic acid copolymer, a cellulose derivative, a poly(acrylamide), a copolymer of methacrylic acid, polyvinyl alcohol, and a copolymer of polyvinyl alcohol.

10. The method of claim 8, wherein the photobleachable dye solution or dispersion further comprises a water insoluble polymer binder.

11. The method of claim 10, wherein the water insoluble polymer binder is poly(methyl methacrylate) or copolymers of poly(methyl methacrylate).

12. The method of claim 10, wherein the contrast enhancing system is removed and the photoresist layer is developed during the same processing step or in separate steps comprised of a water rinse followed by treatment with developer.

13. The method of claim 8, wherein the photobleachable dye solution or dispersion comprises a nonpolar solvent.

14. The method of claim 13, wherein the nonpolar solvent is propylene glycol methyl ether acetate.

15. A contrast enhanced photolithographic method, comprising:

forming a photoresist layer on a substrate;

forming on the photoresist layer a contrast enhancing system comprising a solution or dispersion of a photobleachable dye having a formula

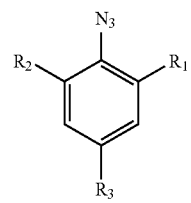

wherein one or more of $R_1$, $R_2$, and $R_3$ represents a polar substituent group;

through an imaging pattern and through the contrast enhancing system exposing the photoresist layer to radiation having a wavelength between about 230 nm and about 300 nm;

removing the contrast enhancing system; and developing the photoresist layer to form a photoresist pattern on the substrate.

16. The method of claim 15, further comprising heating the photoresist layer to a temperature between about 40° C. and about 140° C. before or after the contrast enhancing system has been removed.

17. The method of claim 15, wherein one or both of substituents $R_1$ and $R_2$ are cyclohexyl.

18. The method of claim 15, wherein the photobleachable dye solution or dispersion is formed directly on the photoresist layer.

19. The method of claim 18, wherein the photobleachable dye solution or dispersion further comprises a water soluble polymer binder.

20. The method of claim 19, wherein the polymer binder is acidic and comprises one or more of a homopolymer of polyacrylic acid, polymethacrylic acid, acrylic copolymers of polyacrylic, and ethylene copolymers of polyacrylic and polymethacrylic acid.

21. The method of claim 19, wherein the contrast enhancing system is removed and the photoresist layer is developed during the same processing step.

22. The method of claim 18, wherein the photobleachable dye solution or dispersion further comprises a polar solvent.

23. The method of claim 15, wherein the polar solvent comprises water or solutions of water and water-miscible solvents.

24. The method of claim 15, wherein the contrast enhancing system further comprises a barrier layer disposed between the photoresist layer and the photobleachable dye solution or dispersion.

25. The method of claim 24, wherein the barrier layer comprises a water soluble polymer selected from an acrylic acid polymer, an acrylic acid copolymer, a cellulose derivative, a poly(acrylamide), a copolymer of methacrylic acid, polyvinyl alcohol, and a copolymer of polyvinyl alcohol.

26. The method of claim 24, wherein the photobleachable dye solution or dispersion further comprises a water insoluble polymer binder.

27. The method of claim 26, wherein the water insoluble polymer binder is selected from a copolymer of poly(acrylic acid), and a copolymer of polymethacrylic acid.

28. The method of claim 26, wherein the contrast enhancing system is removed and the photoresist layer is developed during the same processing step or in separate steps comprised of a water rinse followed by treatment with developer.

29. The method of claim 24, wherein the photobleachable dye solution or dispersion comprises a nonpolar solvent.

30. The method of claim 29, wherein the nonpolar solvent is propylene glycol methyl ether acetate.

31. A contrast enhanced photolithographic method, comprising:
   forming a photoresist layer on a substrate;
   forming on the photoresist layer a contrast enhancing system comprising a solution or dispersion of a photobleachable dye isomerizable upon exposure to radiation having a wavelength between about 230 nm and about 300 nm from a cis-isomer substantially absorptive of radiation having a wavelength between about 230 nm and about 300 nm to a trans-isomer substantially transmissive to radiation having a wavelength between about 230 nm and about 300 nm;
   through an imaging pattern and through the contrast enhancing system exposing the photoresist layer to radiation having a wavelength between about 230 nm and about 300 nm;
   removing the contrast enhancing system; and
   developing the photoresist layer to form a photoresist pattern on the substrate.

32. The method of claim 31, further comprising heating the photoresist layer to a temperature between about 40° C. and about 140° C. before or after the contrast enhancing system has been removed.

33. The method of claim 31, wherein the photobleachable dye comprises a 1,4-bis(4-ethynylstyryl)benzene compound.

34. The method of claim 33, wherein the 1,4-bis(4-ethynylstyryl)benzene compound is dispersed in a polymer binder.

35. The method of claim 34, wherein the polymer binder is nonpolar.

36. The method of claim 35, wherein the polymer binder comprises one or more of polystyrene and a nonpolar acrylic.

37. The method of claim 33, wherein the photobleachable dye solution or dispersion further comprises a nonpolar solvent.

38. The method of claim 31, wherein the photobleachable dye solution or dispersion is composed of between about 20 and 50% by weight photobleachable dye.

39. The method of claim 31, wherein the contrast enhancing system further comprises a barrier layer disposed between the photoresist layer and the photobleachable dye solution or dispersion.

40. The method of claim 39, wherein the barrier layer comprises a water soluble polymer selected from an acrylic acid polymer, an acrylic acid copolymer, a cellulose derivative, a poly(acrylamide), a copolymer of methacrylic acid, polyvinyl alcohol, and a copolymer of polyvinyl alcohol.

* * * * *

UNITED STATES PATENT AND TRADEMARK OFFICE
CERTIFICATE OF CORRECTION

PATENT NO. : 7,022,452 B2
APPLICATION NO. : 10/234931
DATED : April 4, 2006
INVENTOR(S) : Lu Page 1 of 1

It is certified that error appears in the above-identified patent and that said Letters Patent is hereby corrected as shown below:

On Title Page, Item (56), under "Other Publications", in column 2, line 9, delete "Photactive" and insert -- Photoactive --, therefor.

On Title Page, Item (56), under "Other Publications", in column 2, line 22, delete "Verlag." and insert -- Verlag, --, therefor.

Signed and Sealed this

Fifteenth Day of August, 2006

JON W. DUDAS
*Director of the United States Patent and Trademark Office*